(12) United States Patent
Gambino et al.

(10) Patent No.: US 6,252,271 B1
(45) Date of Patent: *Jun. 26, 2001

(54) FLASH MEMORY STRUCTURE USING SIDEWALL FLOATING GATE AND METHOD FOR FORMING THE SAME

(75) Inventors: Jeffrey P. Gambino, Gaylordsville, CT (US); Louis L. Hsu, Fishkill, NY (US); Jack A. Mandelman, Stormville, NY (US); Donald C. Wheeler, Beacon, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/097,515

(22) Filed: Jun. 15, 1998

(51) Int. Cl.$^7$ .................................................. H01L 29/788
(52) U.S. Cl. ........................... 257/315; 257/316; 257/317
(58) Field of Search ...................................... 257/314, 315, 257/316, 317, 318, 319, 320, 321, 322; 438/201, 211, 257, 264, 266

(56) References Cited

U.S. PATENT DOCUMENTS

| | | |
|---|---|---|
| 4,419,809 * | 12/1983 | Riseman et al. ..................... 438/231 |
| 4,599,118 * | 7/1986 | Han et al. ............................. 438/291 |
| 4,794,565 | 12/1988 | Wu et al. .............................. 257/316 |
| 5,021,848 | 6/1991 | Chin ..................................... 257/317 |
| 5,053,842 | 10/1991 | Kojima ................................. 257/316 |
| 5,115,288 | 5/1992 | Manley ................................ 257/316 |
| 5,241,202 | 8/1993 | Lee ....................................... 257/315 |
| 5,258,634 * | 11/1993 | Yang .................................... 257/316 |
| 5,267,194 | 11/1993 | Jang ..................................... 257/315 |
| 5,402,374 | 3/1995 | Tsuruta et al. ....................... 257/316 |
| 5,483,487 | 1/1996 | Sung-Mu ............................. 257/315 |
| 5,554,553 | 9/1996 | Harari .................................. 438/264 |
| 5,587,332 | 12/1996 | Chang et al. ........................ 438/258 |
| 5,633,519 * | 5/1997 | Yamazaki et al. ................... 257/315 |
| 5,656,544 | 8/1997 | Bergendahl et al. ................ 438/386 |

* cited by examiner

Primary Examiner—Steven Loke
Assistant Examiner—Hung Kim Vu
(74) Attorney, Agent, or Firm—McGinn & Gibb, PLLC; Todd C. Li

(57) ABSTRACT

A flash memory and a method of forming a flash memory, includes forming a polysilicon wordline on a substrate, the wordline having first and second sidewalls, the first sidewall being tapered, with respect to a surface of the substrate, to have a slope angle and the second sidewall having a slope angle greater than the slope angle of the first sidewall. Thereafter, a polysilicon spacer is formed on the second sidewall while simultaneously removing the polysilicon on the first sidewall. The polysilicon spacer forms a floating gate which is surrounded on a plurality of sides by the second sidewall.

7 Claims, 11 Drawing Sheets

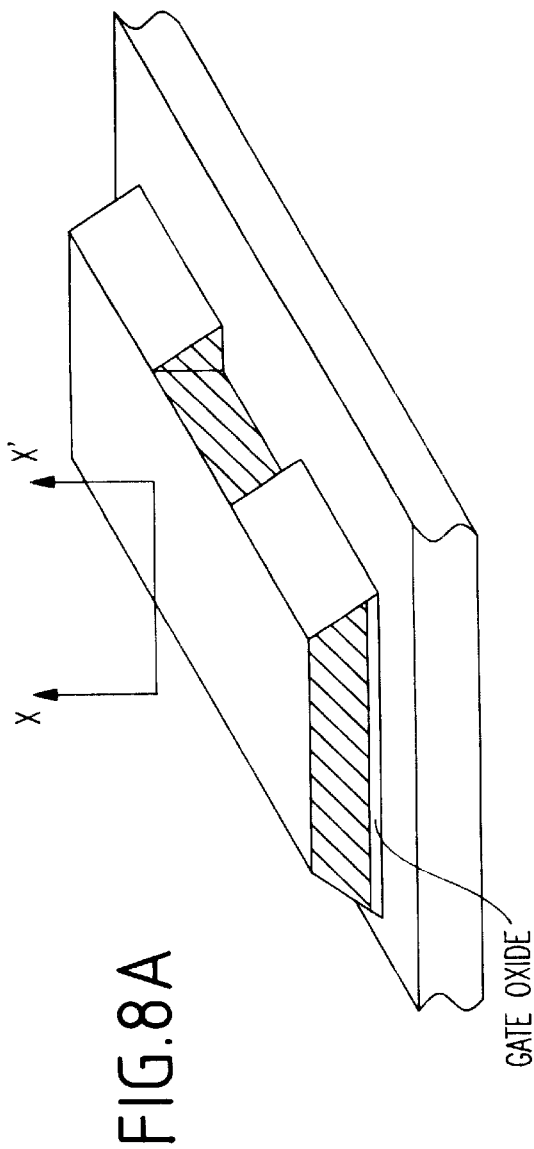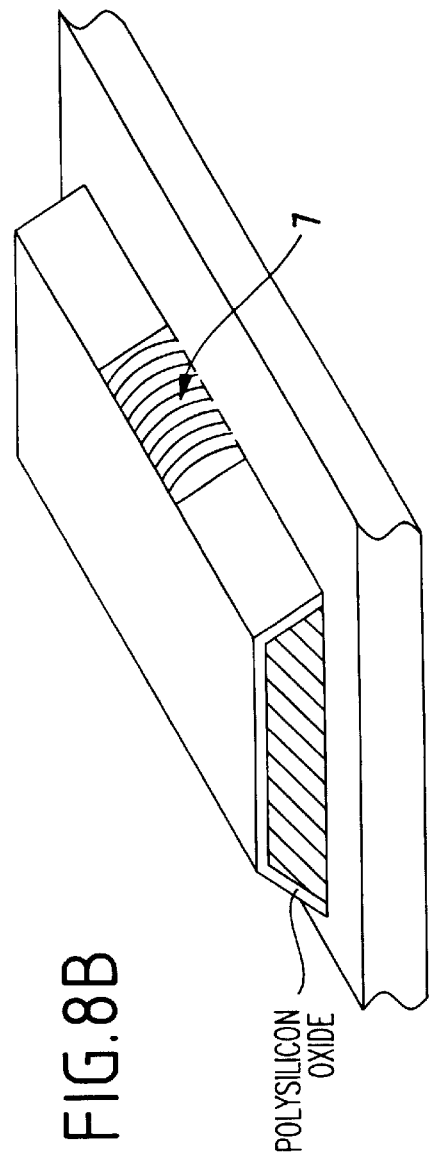

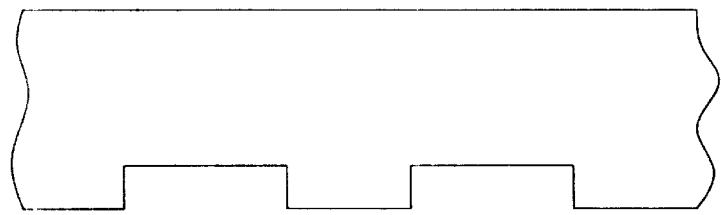
FIG. 21
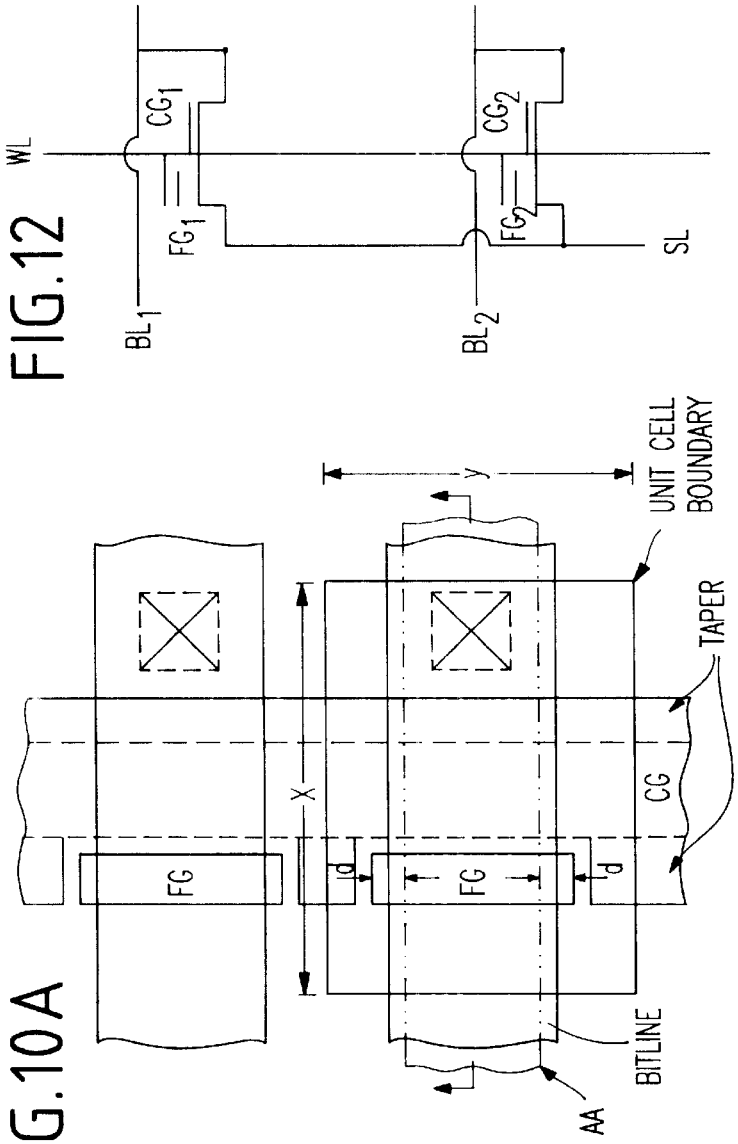
FIG. 12
FIG. 10A
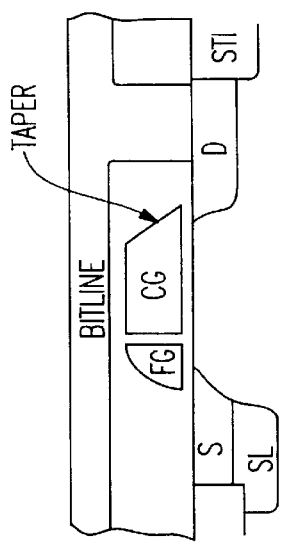
FIG. 11

FLASH MEMORY STRUCTURE USING SIDEWALL FLOATING GATE AND METHOD FOR FORMING THE SAME

CROSS-REFERENCE TO RELATED APPLICATION

The present application is related to U.S. patent application Ser. No. 09/298,920, entitled "FLASH MEMORY STRUCTURE USING SIDEWALL FLOATING GATE HAVING ONE SIDE THEREOF SURROUNDED BY CONTROL GATE", filed on Jun. 6, 1998, to Hsu et al., having IBM Docket No. FI9-98-078, assigned to the present assignee, and incorporated herein by reference.

BACKGROUND OF THE INVENTION

1. Field of the Invention

The present invention generally relates to a flash memory and a method of forming a flash memory, and more specifically a method of forming a flash memory cell using an asymmetric control gate with a sidewall floating gate.

2. Description of the Related Art

A flash memory is unique in providing fast compact storage which is both nonvolatile and rewritable.

In a flash memory, the threshold voltage Vt for conduction of a field effect transistor (FET) changes state depending upon the amount of charge stored in a floating gate (FG) part of the FET. The floating gate is a charge storing region which is isolated from a more traditional gate conductor CG (control gate or "wordline") by a thin dielectric. The states of the Vt change with the amount of charge stored by the FG.

Since the FG directly controls conductivity between source and drain in a channel, the state of a FG memory cell is determined by applying certain voltages to the source or drain of the FET and observing whether the FET conducts any current.

Flash memory cells with a sidewall floating gate occupy a smaller area than those with conventional (layered) floating gates. For example, in U.S. Pat. No. 5,115,288, sidewall gates were formed on one side of the wordline by employing an extra mask. Sidewall spacers were formed on both edges of the wordline, then removed along one of the edges using the extra mask and an etching operation. Thus, the conventional approach uses a trim mask to define the floating gate.

However, this approach is expensive and requires good control of the overlay for the spacer removal mask.

Other conventional structures also are known. For example, in one structure, polysilicon spacers formed on both sidewalls are used for the floating gate. One spacer sits on top of the tunnel oxide area for programming. The other spacer is called an "added-on floating gate". Both spacers are linked by a polysilicon body. However, a large cell size results.

In a second conventional structure, only one polysilicon spacer is used as the floating gate. A mask must be aligned to the top of the control gate, to remove the other floating gate spacer. Hence, the control gate cannot be small, since, otherwise, any misalignment will cause a problem. Therefore, this cell has difficulty in being down-scaled.

In yet another conventional structure, similar to the second conventional structure described above, a mask is needed to remove a sidewall spacer floating gate. Further, this spacer has a re-entrant corner which is very difficult to be completely removed.

Thus, the conventional methods require extra process steps, material and more precise lithographic alignment, thereby resulting in increased manufacturing costs.

SUMMARY OF THE INVENTION

In view of the foregoing and other problems of the conventional systems and methods, it is an object of the present invention to provide a method for forming a flash memory structure in which there is no (or at the very least minimal) alignment concern for high density device integration.

Another object is to provide a method for forming a flash memory which utilizes phase-shift mask techniques.

In a first aspect of the present invention, a method of forming a flash memory includes forming a polysilicon wordline with a first sidewall on a first side, the first sidewall having a predetermined slope; and forming a polysilicon spacer on a second sidewall, that is less sloped (or not sloped at all) than the first sidewall, while the polysilicon on the first sidewall is being removed (e.g., by being isotropically etched away). The step of forming the wordline includes using a phase-shift mask.

In a second aspect of the present invention, a flash memory is provided which includes a wordline (e.g., control gate) with a slope on a first side and a vertical wall on a second side prior to deposition of polysilicon spacer material. The wordline surrounds the floating gate on a plurality of sides (e.g., at least two sides), and the floating gate is self-isolated from adjacent floating gate devices by the gate conductor.

With the unique and unobvious aspects and features of the present invention, a flash memory is formed which includes a phase-shift mask, which includes less steps and material, and in which the control gate CG surrounds the floating gate (FG) on a plurality of sides (e.g., at least two sides).

Specifically, the FG is surrounded by the control gate on at least two sides. Additionally, the FG is fabricated to an extremely small size and is self-isolated from adjacent FG devices by the gate conductor.

Further, the simple process steps and self-alignment scheme of the present invention result in not only high device packing density but also decreased costs.

BRIEF DESCRIPTION OF THE DRAWINGS

The foregoing and other objects, aspects and advantages will be better understood from the following detailed description of a preferred embodiment of the invention with reference to the drawings, in which:

FIG. 8A illustrates a perspective view of the completed gate structure with tapered and vertical sidewalls, produced by the method illustrated in FIGS. 1–7, with the corresponding cross-sectional view along the X–X' direction being shown in FIG. 3;

FIG. 8B illustrates floating gate spacers formed in the vertical sidewall areas;

FIG. 10A illustrates a final layout structure of the method illustrated in FIGS. 1–7 for a floating gate surrounded on three sides by a control gate;

FIG. 11 illustrates a device cross-section of the device shown in FIG. 3;

FIG. 12 schematically illustrates a circuit formed by the method of the first preferred embodiment;

FIG. 21 illustrates a top view of gate 13 of the structure shown in FIG. 13 with notches formed on one side of the control gate.

DETAILED DESCRIPTION OF PREFERRED EMBODIMENTS OF THE INVENTION

Figure 1:
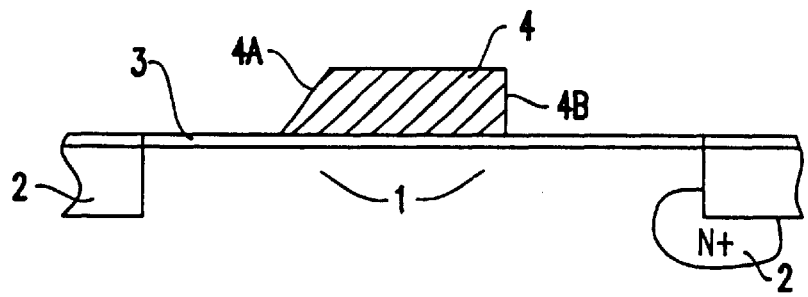
FIGS. 1–7 illustrate a method of forming a semiconductor device, such as a flash memory, according to a first preferred embodiment of the present invention.

Referring now to the drawings, and more particularly to FIGS. 1–7, there is shown a first preferred embodiment of the present invention.

Generally, the present inventors have discovered a solution to the above-mentioned problems of the conventional methods and structures, which is to make a wordline (or control gate) that has a sloped sidewall on one edge (side) which has a slope which is less than that of a second sidewall.

For purposes of the present invention, "slope" is defined as the angle formed by the sidewall with respect to the surface of the underlying substrate upon which the sidewall is formed. Thus, a slope which is relatively gradual (e.g., about 45 degrees) would have a lesser angle (and thus have a lesser slope) than a slope which was more extreme (e.g., about 90 degrees) typically formed by what is referred to as a "vertical sidewall".

Forming the wordline having a sloped sidewall can be achieved with an appropriate phase shift mask as described below in the first preferred embodiment, without using a trim mask, or by the second preferred embodiment which requires a trim mask for trimming and selectively forming a spacer for the floating gate. Because of the tapered (sloped) sidewall, spacers are formed on only the non-sloped edge of the wordlines.

In the first embodiment, the trim mask also can be eliminated if appropriate sections of the wordline along the floating gate edge are also tapered. By providing tapered regions between the floating gates, the floating gates can be isolated with no additional masks (since sidewalls will not form in the tapered regions between the floating gates).

In the second embodiment, floating gate sidewalls can be selectively formed along the non-sloped edge of the device. A trim mask is used, so that the floating gates are isolated from each other.

Turning now to the detailed method and structure of the invention, several exemplary process flows for fabricating the new flash memory structure are described below. The first preferred embodiment of the inventive method includes using no trim mask, whereas the second preferred embodiment of the inventive method requires using the trim mask. Both methods result in the inventive floating gate surrounded on at least two sides by the control gate.

First Embodiment

First, referring to FIG. 1, in step 1, a silicon substrate 1 with well and isolation structures is formed which includes an implanted $n^+$ diffusion region 2. The buried $n^+$ diffusion region 2 is used for the source connection of the cells. It is noted that, instead of forming the buried interconnect by $n^+$ diffusion, $p^+$ diffusion also can be employed. Alternatively, the buried interconnect may be formed of a metal line such as tungsten or silicide, as long as low resistivity for the wire results.

In step 2, after a gate oxide 3, preferably formed by thermal oxidation and having a thickness within the range of 6.0 nm to 12 nm, is formed over the substrate 1, and a gate material 4, preferably formed of polysilicon doped with $n^+$ or $p^+$-type dopant, is deposited.

A special lithographic patterning, as described in U.S. patent application Ser. No. 09/010,611, filed on Jan. 22, 1998 by the assignee of the present application, IBM Corporation, and entitled "MULTI-PHASE MASK", incorporated herein by reference, is performed so that after gate reactive ion etching (RIE), one sidewall 4B of the gate 4 is "vertical" and the other sidewall 4A of the gate 4 (either a portion of the sidewall as shown in the first embodiment of the present invention, or the whole sidewall as shown in the second embodiment of the present invention) is "tapered", as shown in FIG. 1.

For purposes of the present application, a "vertical" sidewall is defined as the sidewall 4B being substantially perpendicular to the surface of the substrate 1 upon which the gate 4 is formed. A "tapered" sidewall is defined as the sidewall 4A having a surface which is other than substantially perpendicular to the surface of the silicon substrate 1, and more specifically as having a surface forming an angle less than about 90 degrees with respect to the surface of the substrate 1 upon which the gate 4 is formed. A preferred angle of taper is within a range of substantially about 45 to 65 degrees. This range is preferable since an angle less than about 45 degrees is not generally reproducible, whereas an angle greater than about 65 degrees may form sidewall spacers.

It is noted that, as described above, the invention provides a tapered sidewall having a predetermined "slope". Further, it is noted that the second sidewall need not be vertical, but instead may simply have a greater slope than that of the tapered sidewall. As described above, the slope is defined as the angle formed by the sidewall with the surface of the underlying substrate upon which the sidewall is formed. Thus, the slope of the tapered sidewall is less than that of the second sidewall (e.g., which in the exemplary embodiment may be substantially vertical but at the very least has a greater slope (angle) than the tapered sidewall).

Figure 2:
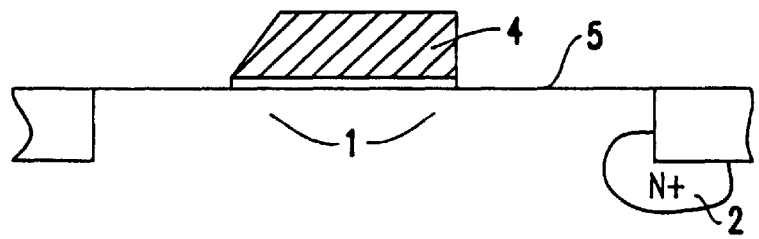

In step 3, as shown in FIG. 2, after selectively removing the gate oxide 3 in the exposed area, a layer of thin nitride 5 is deposited in-situ, which will become the gate dielectric for the floating gate. For example, a preferred nitride would be chemical vapor deposition (CVD) nitride having a thickness of preferably substantially within a range of about 6–12 nm.

The in-situ nitride deposition ensures that there is no native oxide underneath the nitride layer, which would degrade the gate insulator. Specifically, right after the removal of gate oxide 3, the wafer should remain in an environment where no oxygen is present. Otherwise, a native oxide may be formed, in which case the effective gate oxide thickness is not controlled or is non-uniform.

Figure 3:
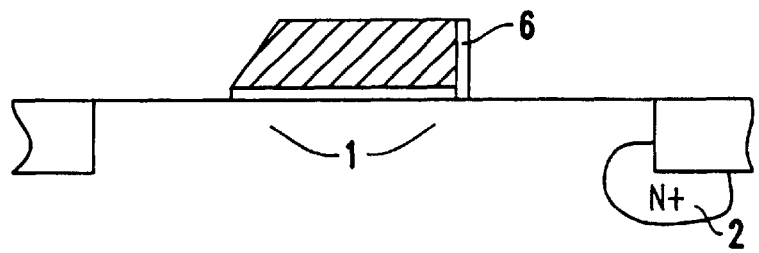

Thereafter, in step 4, as shown in FIG. 3, thermal oxidation is performed so that, at the interface of the nitride 5 and the polysilicon gate 4, and at the interface of the nitride 5 and the silicon substrate 1, a thin layer of oxide 6 is grown. Typically, the thickness of the oxide 6 is substantially in the range of about 2 to 5 nm.

The oxidation is performed such that oxygen is diffused through the nitride, with the interface of the nitride/silicon substrate being converted into oxide, so that there will no dangling bonds, for reducing interface trap density for better oxide quality. The oxide formed underneath the nitride has a very uniform thickness (e.g., substantially within a range of about 2–5 nm).

Figure 4B:
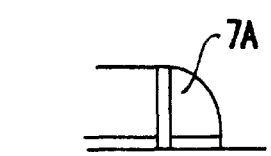
Figure 4C:
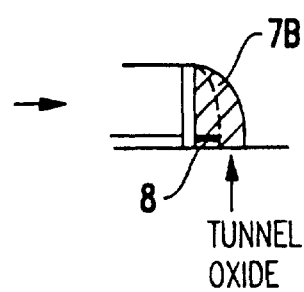
Figure 4A:
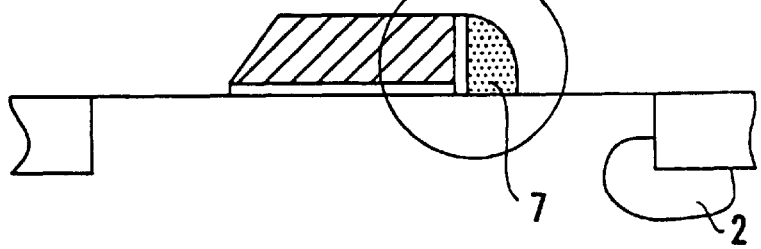

Then, in step 5, as shown in FIGS. 4A–4C, a sidewall floating gate 7 is formed using a spacer process (e.g., a polysilicon deposition followed by RIE, to form a polysilicon spacer). To provide a tunneling region 8 underneath the floating gate 7 (e.g., as shown in the details of FIGS. 4B and 4C), a double spacer process may be used. The spacer process and the double spacer process are described below.

That is, the first spacer 7A is formed on top of the nitride/oxide surface. Then, the nitride layer is removed by dry or wet etching, leaving the thin oxide layer, having a thickness, for example, in the range of about 2 to 5 nm, as the tunnel oxide layer before forming the second polysilicon spacer 7B.

Some advantages of the double spacer process are that: (1) the tunneling oxide is located away from the gate (e.g., the control gate 4) and close to the drain area; and (2) the nitride between the control gate 4 and floating gate 7 is protected by the first spacer 7A during the nitride removal step.

Figure 5:
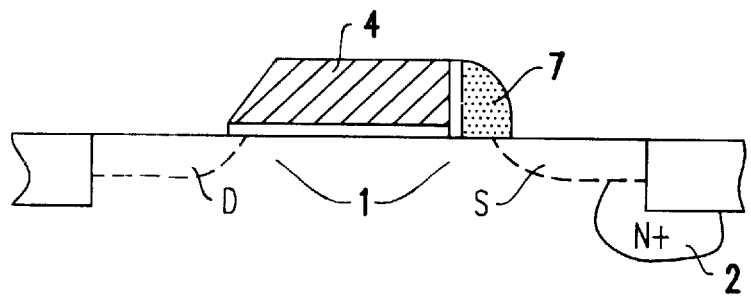

Thereafter, in step 6, the source and drain implants S, D, are performed using conventional processing, as shown in FIG. 5 and as well-known in the art.

Figure 6:
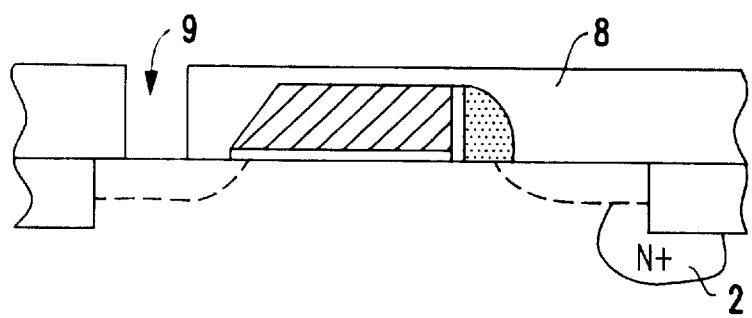
Figure 7:
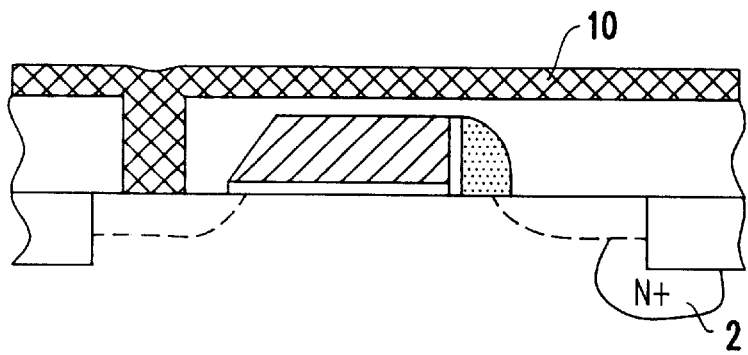

In step 7, as shown in FIGS. 6 and 7, respectively, a dielectric 8 and interconnects/vias 9 for forming bitlines 10 are formed by conventional processing. The dielectric may include TEOS, CVD oxide and/or doped glass having a thickness of, for example, substantially within a range of about 100 to 1000 nm.

A three-dimensional diagram of the gate structure with tapered and vertical sidewalls 4A, 4B, respectively, is shown in FIG. 8A, and the corresponding cross-sectional view along the X–X' direction is shown in FIG. 3. Further, FIG. 8A illustrates a gate oxide as shown. The floating gate spacers are formed in the vertical sidewall areas, as shown in FIG. 8B, and a polysilicon oxide is provided as shown in FIG. 8B.

Figure 8C:
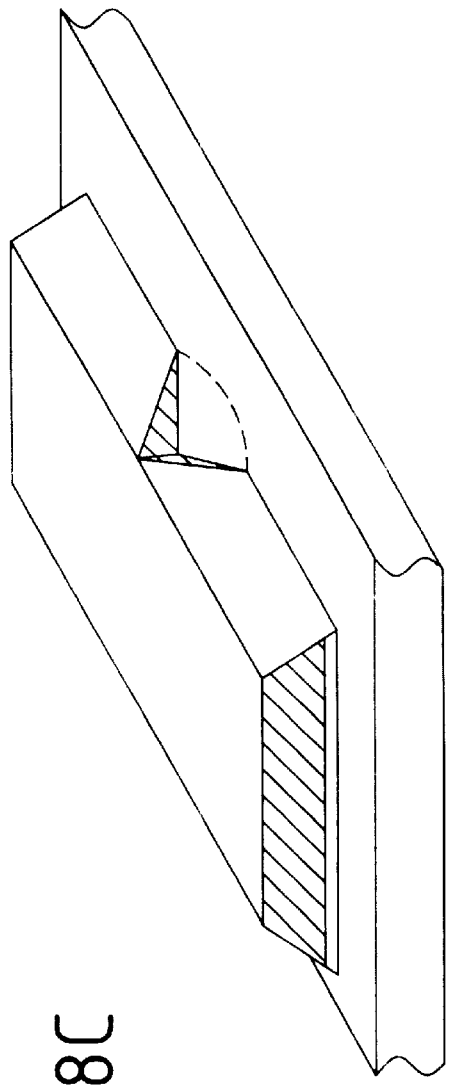
FIGS. 8C and 8D are similar to FIGS. 8A and 8B, but illustrate a completed control gate structure with sidewalls for surrounding a floating gate 7' on only two sides.
Figure 8D:
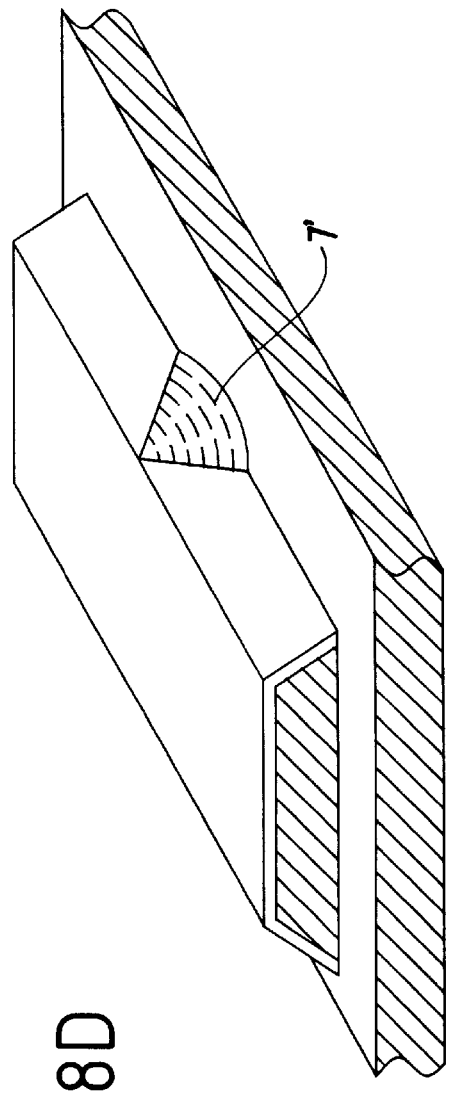

It is noted that the process of FIGS. 1–7 can be used to form a floating gate which is surrounded on only two sides by the control gate. For example, FIGS. 8C and 8D are similar to FIGS. 8A and 8B, but illustrate a completed control gate structure with sidewalls for surrounding a floating gate 7' on only two sides. Specifically, a notch is formed in a sidewall of the control gate, as shown in FIG. 8C. As shown in FIG. 8D, a floating gate 7' is formed therein such that the floating gate 7' is surrounded on only two sides by the control gate.

Figure 9A:
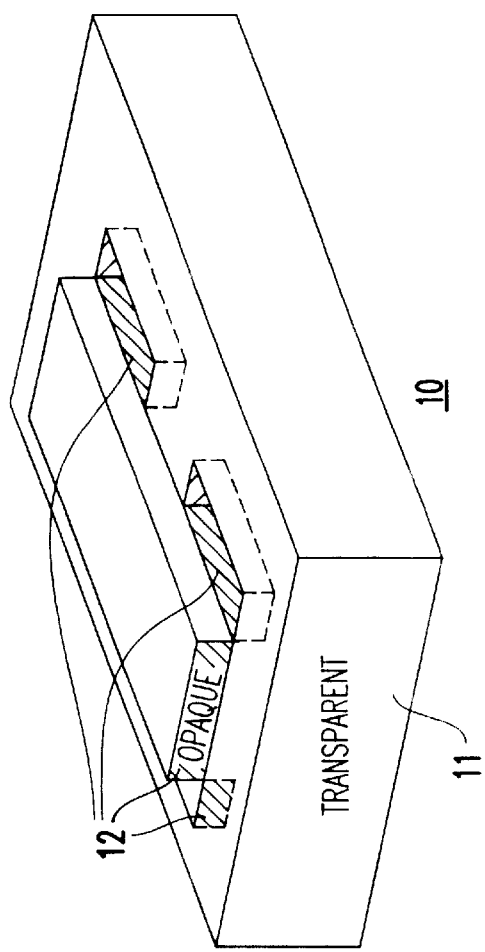
FIGS. 9A and 9B are a perspective view and a top view, respectively, of a phase-shift mask structure 10 for creating controlled tapered structures.
Figure 9B:
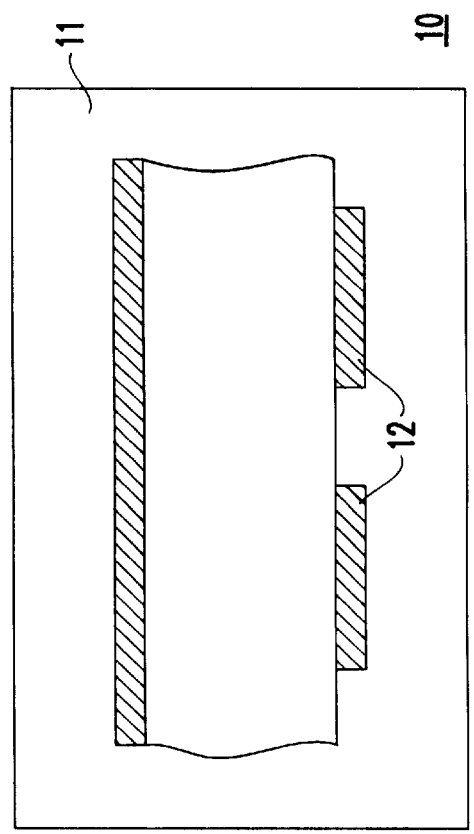

A three-dimensional diagram of the mask structure 10 to create controlled tapered structures is shown in FIG. 9A. The phase shift regions of the mask are on the transparent substrate 11 where tapered shapes are required. The opaque mask 12 without phase shift modifications are regions where vertical sidewalls are required. A top view of the mask is shown in FIG. 9B.

Figure 9C:
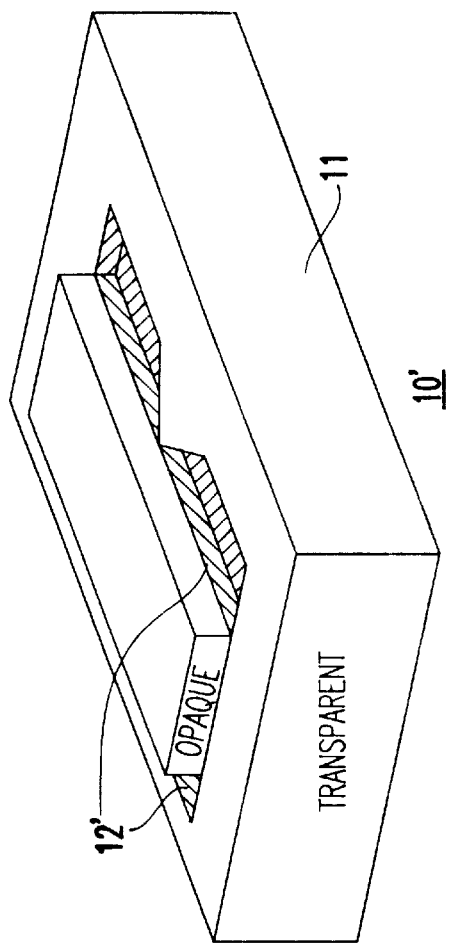
FIGS. 9C and 9D are a perspective view and a top view, respectively, of a phase-shift mask structure 10' for creating controlled tapered structures shown in FIGS. 8C and 8D (e.g., a floating gate surrounded on only two sides by the control gate)
Figure 9D:
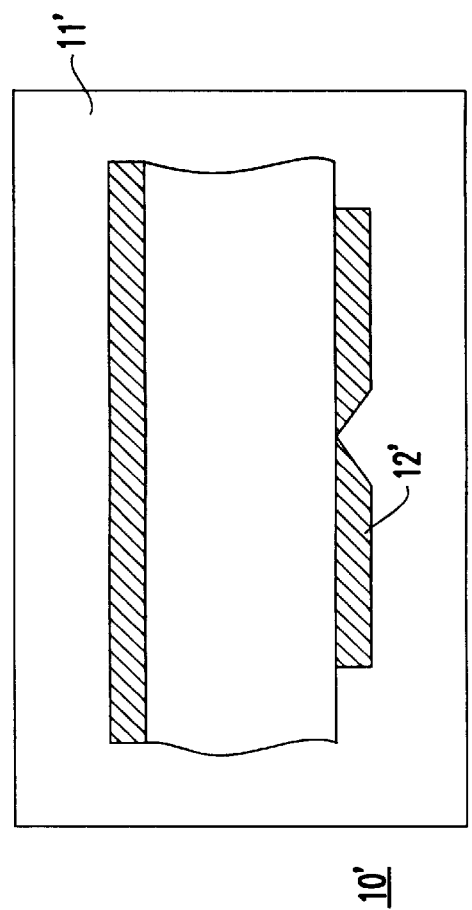

FIGS. 9C and 9D are a perspective view and a top view, respectively, of a phase-shift mask structure 10' for creating controlled structures shown in FIGS. 8C and 8D (e.g., a floating gate surrounded on only two sides by the control gate). Similarly to FIGS. 9A and 9B, the mask 10' includes a transparent substrate 11' and an opaque mask 12'.

As shown in FIG. 10A, the FG must overlap the active area (AA) by a minimum dimension "d" to ensure that normal function of the flash memory. If overlapping by "d" does not occur by the FG, then the device performance will be erratic (e.g., large variation in programmability) and resulting in undetermined threshold voltage of a non-volatile random access memory (NVRAM) cell.

Figure 10B:
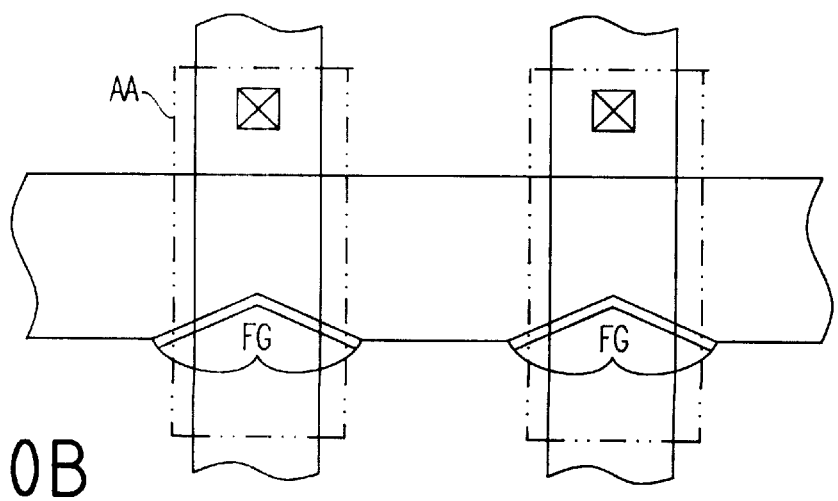
FIG. 10B illustrates a final layout structure of the method illustrated in FIGS. 1–7 for a floating gate surrounded on only two sides by a control gate.

In FIG. 10A, a unit cell layout is shown within the unit cell boundary. All of the cells will have the same x and y dimensions. FIG. 10B illustrates a final layout structure of the method illustrated in FIGS. 1–7 for a floating gate surrounded on only two sides by a control gate.

The details of the lithographic technique for making the sloped sidewalls of the gate conductor line, as shown in FIGS. 8A and 8C, are known, and, for example, are described in the above-mentioned U.S. patent application Ser. No. 09/010,611, filed on Jan. 22, 1998 by IBM Corporation, and entitled "MULTI-PHASE MASK", incorporated herein by reference.

The final layout structure, device cross-section of the final layout structure, and circuit schematic (e.g., for the structure having the floating gate surrounded on three sides, are shown in FIGS. 10A, 11 and 12, respectively. FIG. 10B illustrates a final layout structure of the two-sided surrounded floating gate structure.

FIGS. 10A–12 illustrate two adjacent cells which share a wordline.

FIG. 12 illustrates a schematic for both the first and second embodiments (described below) in which two adjacent flash memory cells are shared by the same word line WL. The first cell has a first bitline $BL_1$, and control gate $CG_1$ and floating gate $FG_1$. The second cell has a second bitline $BL_2$, control gate $CG_2$ and a floating gate $FG_2$. The sources of the two cells are joined by a source line SL which is used for cell erasure.

With the method and structure of the first embodiment of the present invention, the pattern density of the flash memory can be significantly improved. The method according to the first embodiment of the present invention not only eliminates using a trim mask, but also provides greater flexibility of cell layout, which is suitable for a very high density flash memory integration.

Further, the inventive flash memory formed by the method of the invention includes a control gate (the gate conductor) which surrounds the floating gate (FG) on a plurality of sides.

Specifically, the FG is surrounded by the control gate on at least two sides (e.g., two sides most clearly seen in FIGS. 8C and 10B, and three sides most clearly shown in FIGS. 8A and 10A). Additionally, the FG is fabricated to have an extremely small size, and is self-isolated from adjacent FG devices by the gate conductor. This is advantageous in terms of greater integration and performance reliability.

Second Embodiment

Hereinbelow, a second preferred embodiment of the present invention will be described, which does not require phase-shift mask techniques used in the first embodiment described above. Specifically, this method uses a conventional exposed resist/unexposed resist technique where the resist is either uniformly exposed to a given depth or not exposed.

The structure built by the second method including the conventional lithography techniques is substantially the same as that produced by the first embodiment and includes a floating gate surrounded on a plurality of sides (e.g., at least two) by the gate conductor (e.g., control gate). Thus, in this embodiment, the structure obtained is substantially the same as that shown in FIGS. 10A–12. However, the process steps are somewhat different from those described above for the first embodiment of the present invention.

Generally, the conventional lithography method requires a trim mask which requires critical alignment, in order to remove the unwanted sidewall floating gate. Hereinbelow is described a method employing conventional lithographic techniques to produce the three-sided-surrounded sidewall floating gate structure. Two approaches are discussed below.

FIGS. 13–17 illustrate the process steps to form a three-sided surrounded sidewall floating gate.

Figure 16:
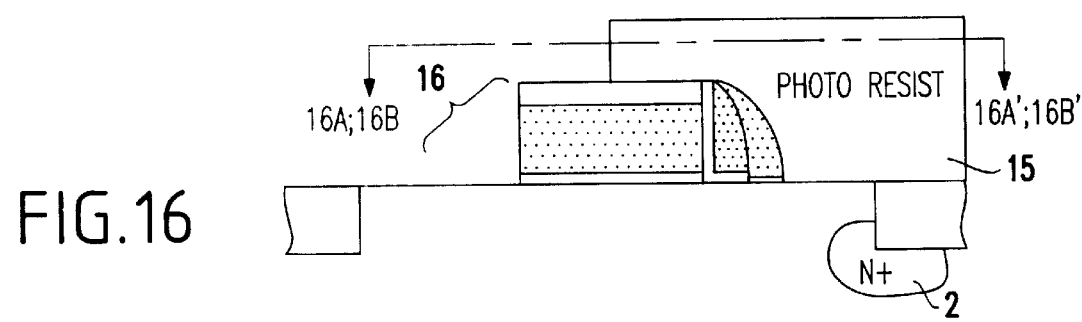
Figure 16A:
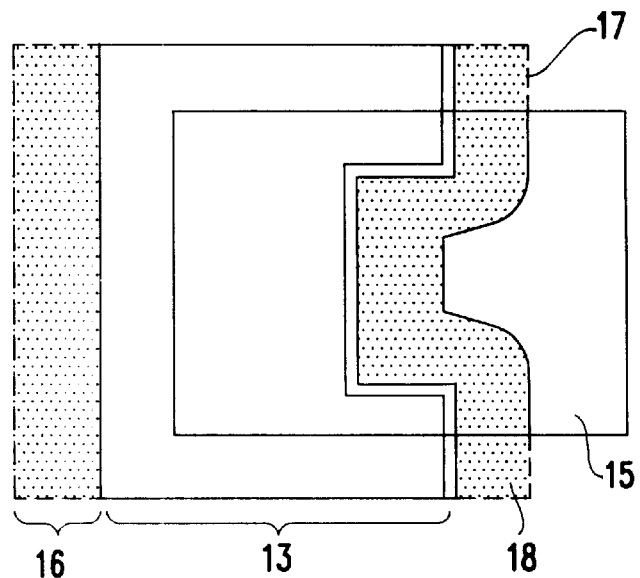
Figure 16B:
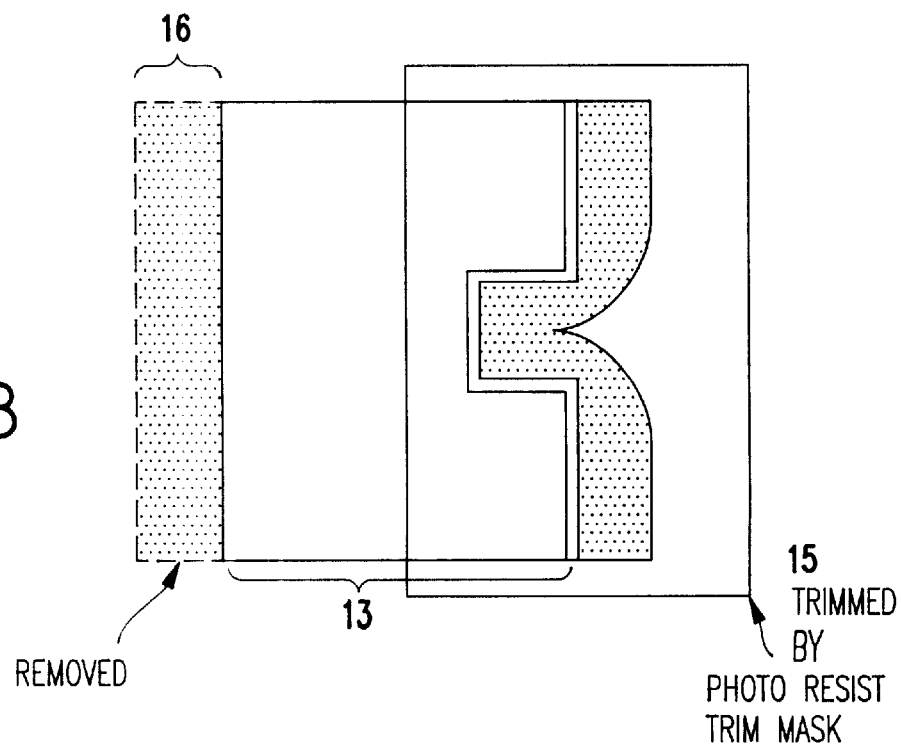

FIGS. 16A and 16B illustrate the beginning steps for the first and second trimming approaches, respectively. FIGS. 16A and 16B are top cross-sectional views as shown by the cross-section axis lines and arrows (e.g., 16A–16A' and 16B–16B') in FIG. 16. The remaining process steps for the first approach are shown from FIGS. 18A, 19A and 20A, and for the second approach are shown FIGS. 18B, 19B, and 20B.

Figure 13:
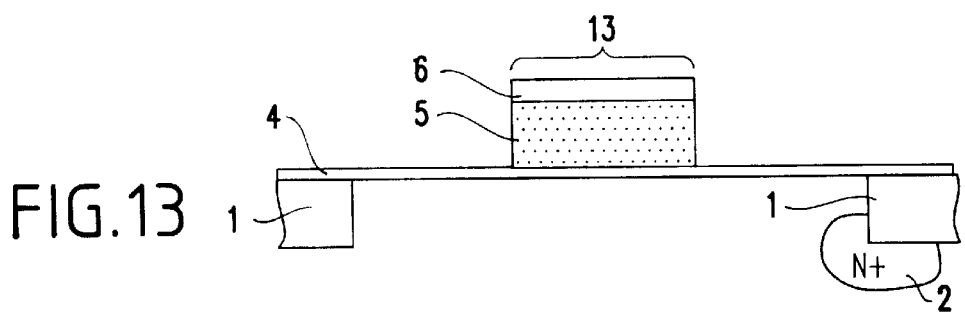
FIGS. 13–20 schematically illustrate a circuit formed by the method of a second preferred embodiment, with FIGS. 16A, 17, 18A, 19A, and 20A illustrating a first approach for the second preferred embodiment, and with FIGS. 16B, 17, 18B, 19B, and 20B illustrating a second approach for the second preferred embodiment)

In FIG. 13, conventional metal-oxide-semiconductor (MOS) transistor fabrication steps are used to form device isolations 1, or shallow trench isolations (STIs), a buried interconnect 2 (e.g., n+), a gate oxide 4, well structures (not shown), and a gate stack 13 with a doped gate polysilicon 5 and a nitride cap 6. The gate 13 is patterned by conventional lithography and reactive ion etching (RIE) steps.

A top view of the gate pattern is shown in FIG. 21. As shown in FIG. 21, a first side of the gate has a straight sidewall, while a second side of the gate has multiple notches, where the three-side-surrounded floating gate will be formed.

Figure 14:
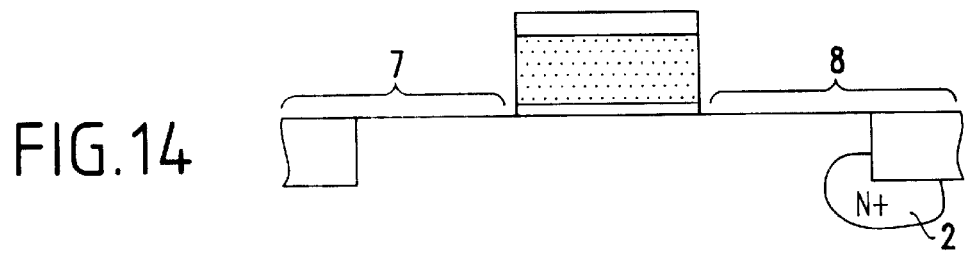

As shown in FIG. 14, the gate oxide exposed in area 7 and 8 is removed (e.g., stripped away) by a conventional wet or dry etch step.

Figure 15:
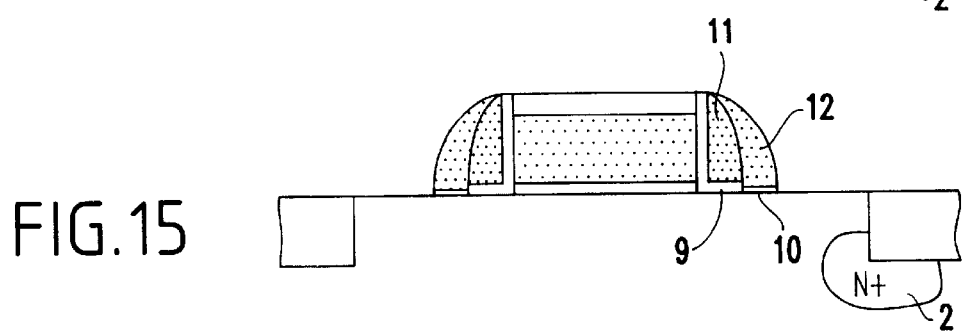

As shown in FIG. 15, a CVD nitride layer is deposited, and then the nitride layer is oxidized, so that a thin layer of oxide will be formed underneath the nitride. The composite oxide/nitride layer 9 is formed on the silicon substrate, as well as at the sidewall of the polysilicon gate.

A first layer of doped CVD polysilicon is deposited, and etched back to form sidewall spacers 11 on both sides of the gate. Etching is continued to remove the nitride layer, and the thin oxide layer is left as the tunneling oxide layer for the second part of the floating gate.

Another layer of polysilicon is deposited and etched back to form the second sidewall spacer 12, again on both sides of the gate stack.

At this stage of the inventive process, two approaches can be applied to perform the floating gate trimming. Generally, a resist pattern is applied, and RIE to remove the unwanted floating gate material using the existing cap nitride as a mask to protect the control gate material.

First Trimming Approach

FIGS. 16, 16A, 17, 18A, 19A, and 20A illustrate the first trimming approach. FIG. 16 illustrates a cross-section of the device having a photoresist 15 as shown for protecting the floating gate area.

Turning now to the first approach for performing the floating gate trimming, FIG. 16A is a top view showing the first approach, in which a photoresist (e.g., resist mask) 15 protects the floating gate area, and the polysilicon sidewall floating gate material outside the trim mask (e.g., portions 16, 17 and 18) is all removed. Thereafter, the resist 15 is stripped away.

Figure 17:
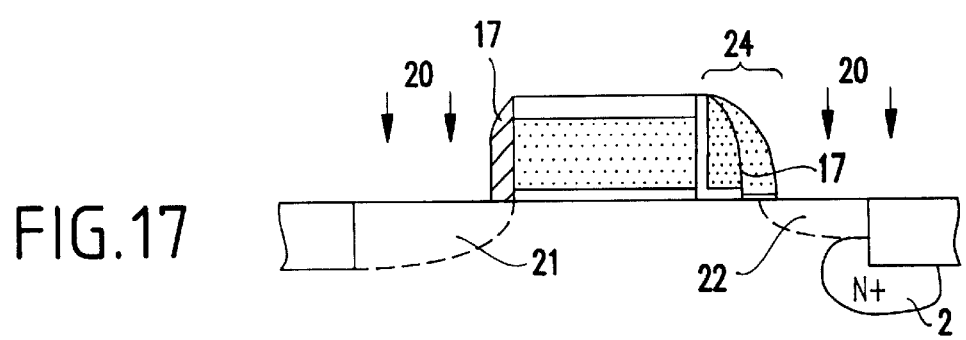

Referring to FIG. 17, a source and drain implantation is performed, and dielectric sidewall spacers are formed on the sidewall of the wordline (e.g., gate stack). Hence, after forming an oxide sidewall 17, source and drain implants 20 and diffusion are performed to form source/drain junctions 21 and 22, respectively. The remaining polysilicon sidewall floating gate 24 will remain in the notch area.

Figure 18A:
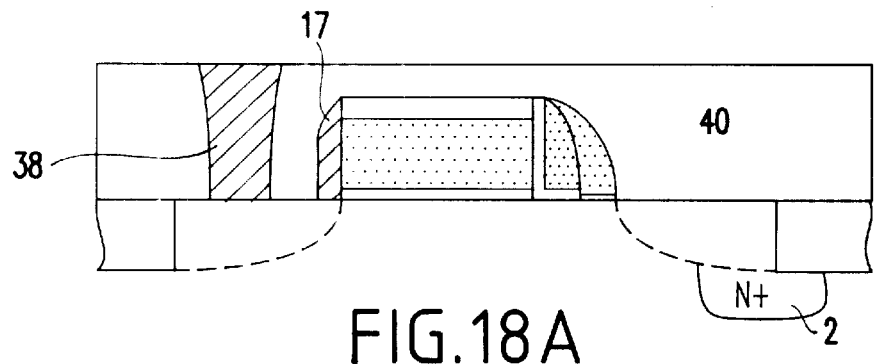
Figure 19A:
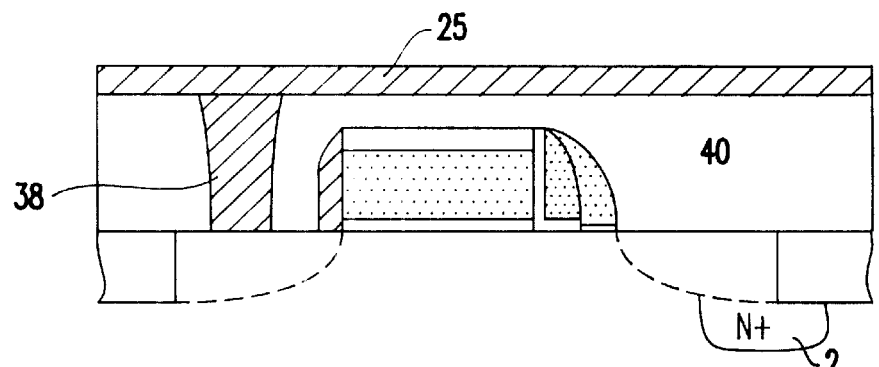

Referring to FIGS. 18A and 19A, a dielectric layer 40 is deposited over the gate sack and substrate, preferably having a thickness substantially within a range of about 50 nm to about 300 nm, and is planarized. A contact hole 38 to the drain of the device is opened, and the contact hole 38 is filled with metal such as, for example, CVD tungsten 38 (or other suitable refractory metal).

As shown in FIG. 19A, a layer of metal (e.g., preferably formed of aluminium, tungsten, silicide, etc. or an alloy thereof) is deposited in a thickness preferably in a range of about 50 nm to 150 nm, and then patterned to form bitline 25.

Figure 20A:
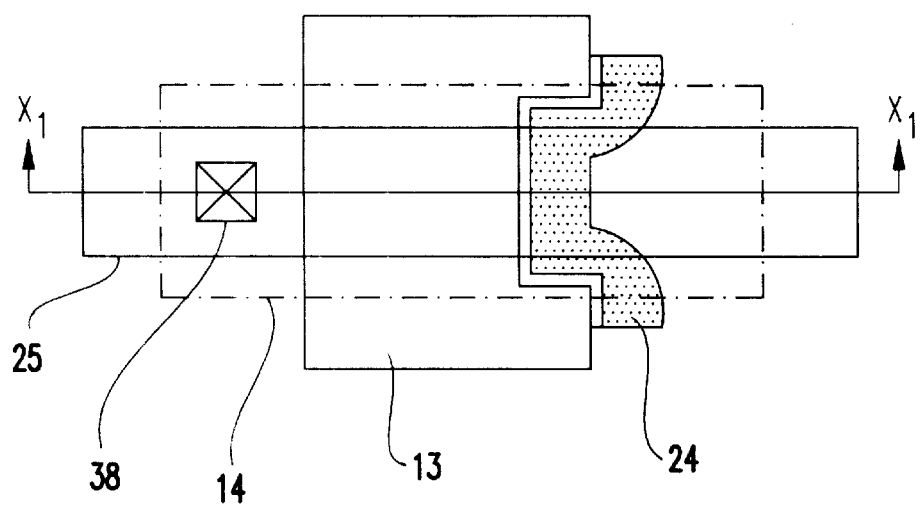
Figure 20B:
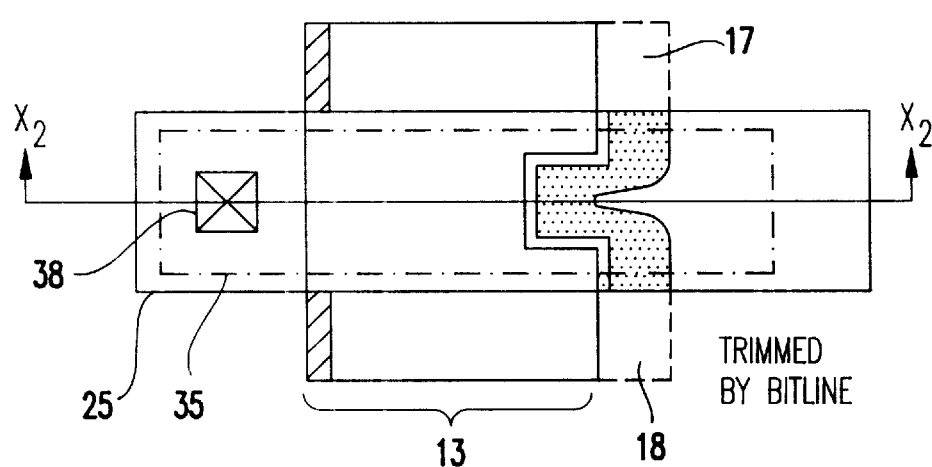

FIG. 20A is a top view of the first approach which shows the bitline 25, its contact 38, active area or shallow trench boundary 14, the control gate 13, and the floating gate 24. The cross-sectional axis is x1–x1'.

Second Trimming Approach

Referring to FIGS. 16, 16B, 17, 18B, 19B, and 20B, a second trimming approach will be described. FIG. 16B is a top view of the second approach, in which the resist mask protects one side of the polysilicon sidewall floating gate with notches. Then, the unwanted polysilicon spacers are removed, and the resist is stripped away.

In FIG. 17, after forming an oxide sidewall 17, source and drain implants 20 and diffusion are performed to form source/drain junctions 21 and 22, respectively.

Figure 18B:
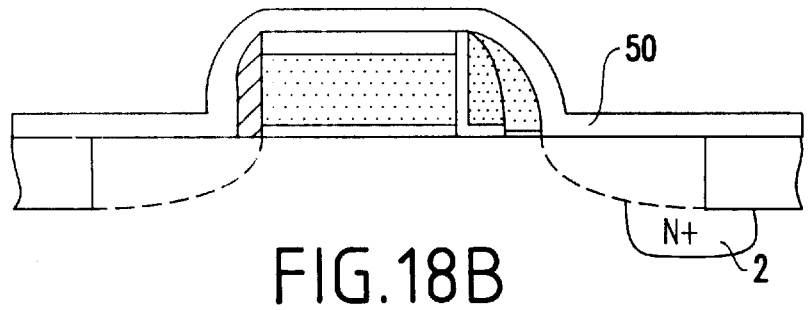

The remaining polysilicon sidewall floating gate 24 will remain in the notch area. Referring to FIG. 18B, a thinner (e.g., thinner than the dielectric layer 40 mentioned above regarding the first trimming approach and thus preferably less than about 50 nm) dielectric layer 50 is deposited, with no planarization being needed.

Figure 19B:
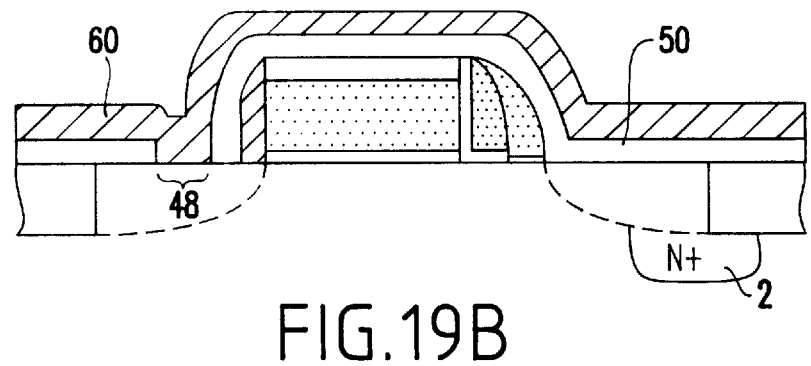

As shown in FIG. 19B, a contact 48 is opened on the dielectric for the bitline contact. A layer of metal similar to that of FIG. 19A (e.g., preferably formed of aluminium, tungsten, silicide, etc. or an alloy thereof) is deposited in a thickness substantially within a range of about 50 nm to 200 nm. The bit line is patterned by conventional lithography and reactive ion etching (RIE). The etch step includes first etching the metal layer 60, then the dielectric layer 50 with high selectivity to the nitride cap, so that the control gate is protected.

Finally, the polysilicon floating gate spacer is etched to remove the unwanted, spacer material 17 and 18. In this case, the active area must be narrower than the bitline, so that the source/drain is self-aligned to the floating gate.

As compared to the first approach, the second approach has a disadvantage of having a non-planar surface. However, the advantage of the second approach is that the floating gate is self-aligned to the transfer device.

As mentioned above, the second preferred embodiment of the inventive method results in substantially the same structure as that shown in FIGS. 8A–12, but utilizes a method not requiring the phase-shift mask.

It is noted that while a three-sided-surrounded sidewall floating gate is shown in FIGS. 13–21 regarding the second embodiment, the structure shown in FIGS. 8C and 10B (e.g., two-sided surrounded structure) can be suitably formed with the techniques of the second embodiment, as would be known by one of ordinary skill in the art taking the present specification as a whole. For brevity and ease of understanding, only the three-sided structure has been shown in FIGS. 13–21 and described above with regard to the second embodiment. However, this should not be taken as limiting the present invention, which clearly contemplates the two-sided surrounded structure being formed by the conventional lithography techniques discussed above.

Thus, the present invention includes unique and unobvious features of a photolithographic technique for creating a unique structure which has great benefit in fabricating a high-density flash memory. The structure preferably is shaped as a polysilicon body with sloping (e.g., tapered) sidewalls in certain regions and steep sidewalls in the remaining regions.

Further, when fabricating a flash memory array, a floating gate can be formed by a sidewall spacer technique along the steep sidewall areas and not along the sloped sidewall areas.

Additionally, by using the inventive method a very high density flash memory can be designed and fabricated with less process steps and a low manufacturing cost.

Finally, this technique also can produce a 3-D floating gate that is surrounded by the control gate on at least two sides which improves the coupling efficiency. This also can be achieved with a large cell design if the conventional lithographic method is utilized.

Hence, the inventive techniques can significantly improve the pattern density of flash memory. The method according to the first embodiment of the present invention not only eliminates the trim mask, but also provides greater flexibility of cell layout, which is suitable for a very high density flash memory integration.

Further, the inventive flash memory formed by the method of the invention includes a control gate (the gate conductor GC) which surrounds the floating gate (FG) on a plurality of sides.

While the invention has been described in terms of several preferred embodiments, those skilled in the art will recognize that the invention can be practiced with modification within the spirit and scope of the appended claims.

What is claimed is:

1. A flash memory, comprising:

a substrate;

a wordline formed on said substrate having, selectively on a first side and a second side, a first sidewall having a first slope angle with respect to said substrate, and, selectively on at least one of a first and a second side, a second sidewall having a second slope angle greater than said first slope angle; and at least one floating gate selectively formed on said second sidewall of the wordline, wherein said at least one floating gate is partially surrounded on a plurality of sides by said second sidewall, said second sidewall for forming a self-aligned floating gate, and wherein an area of said wordline between first and second adjacent floating gates is tapered.

2. The flash memory according to claim 1, wherein said at least one floating gate is selectively formed on only said second sidewall of the wordline, and said substrate comprises silicon, and wherein adjacent ones of said at least one floating gate are isolated from each other and said second sidewall includes tapered regions provided between the adjacent ones of said at least one floating gate.

3. The flash memory according to claim 1, wherein said at least one floating gate includes at least two sides surrounded by said second sidewall.

4. The flash memory according to claim 3, wherein said at least one floating gate includes three sides surrounded by said second sidewall.

5. The flash memory according to claim 1, wherein said floating gate is formed as a maskless floating gate.

6. The flash memory according to claim 1, wherein said second slope angle of said second sidewall is substantially vertical.

7. A flash memory, comprising:

a substrate;

a wordline formed on said substrate having, on a first side, a first sidewall having a first slope angle with respect to said substrate, and, on a second side, a second sidewall having a second slope angle greater than said first slope angle;

at least one floating gate selectively formed on said second sidewall of the wordline, wherein said at least one floating gate is partially surrounded on a plurality of sides by said second sidewall, said second sidewall for forming a self-aligned floating gate; and a source and drain formed in said substrate, said source and drain being co-planar.

* * * * *